US009772348B2

(12) United States Patent
McGrath, Jr. et al.

(10) Patent No.: US 9,772,348 B2
(45) Date of Patent: Sep. 26, 2017

(54) COMPRESSIBLE TEST CONNECTOR FOR COAXIAL CABLES

(71) Applicant: TEKTRONIX, INC., Beaverton, OR (US)

(72) Inventors: James H. McGrath, Jr., Aloha, OR (US); Samuel Romey, St. Paul, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 14/827,751

(22) Filed: Aug. 17, 2015

(65) Prior Publication Data
US 2017/0052213 A1    Feb. 23, 2017

(51) Int. Cl.
*G01R 31/02*    (2006.01)
*G01R 1/04*     (2006.01)
(Continued)

(52) U.S. Cl.
CPC ......... *G01R 1/0416* (2013.01); *G01R 31/021* (2013.01); *H01R 9/0521* (2013.01); *H01R 43/28* (2013.01)

(58) Field of Classification Search
CPC .. G01N 27/4473; G01N 27/902; G01N 22/00; G01R 1/0416; G01R 1/06772; G01R 23/20; G01R 27/32; G01R 31/08; G01R 31/31905; G01R 31/31914; H02H 9/046; H04B 17/00; H04B 2203/5487; H04B 3/46; H04B 3/54; H02G 11/02; H02G 1/1224; H02G 1/1241; H01R 24/38; H01R 24/56;

(Continued)

(56) References Cited

U.S. PATENT DOCUMENTS 3,634,815 A * 1/1972 Stevens ............... H01R 9/0521
439/583
4,864,225 A * 9/1989 Long .................. G01R 1/06772
324/133

(Continued)

FOREIGN PATENT DOCUMENTS

EP           0189846         8/1986

OTHER PUBLICATIONS

Extended European Search Report and Opinion for European Patent Application EP 16184615.9, dated Jan. 24, 2017, 11 pages, European Patent Office, Munich, Germany.

*Primary Examiner* — Vinh Nguyen
(74) *Attorney, Agent, or Firm* — Marger Johnson; Andrew J. Harrington

(57) ABSTRACT

A connector for terminating a cable including a compressible fitting and a crimp nut. The compressible fitting has an inner passage to receive a portion of the cable and a threaded outer wall coaxial with and surrounding the inner passage. The outer wall includes a first slot extending radially through the outer wall and axially away from a first end of the outer wall. The crimp nut is configured to thread onto the outer wall of the compressible fitting. The crimp nut is further configured, in a first position, not to constrict the inner passage and, in a second position, to radially compress the outer wall of the compressible fitting to reduce a bore diameter of the inner passage and to electrically connect the outer wall with the portion of the cable received in the inner passage of the compressible fitting. Methods are also disclosed.

10 Claims, 8 Drawing Sheets

(51) Int. Cl.
*H01R 9/05* (2006.01)
*H01R 43/28* (2006.01)

(58) Field of Classification Search
CPC  H01R 13/56581; H01R 9/05; H01R 13/4538; H01R 43/26; H01R 13/622; H01R 13/623; H01R 24/542; H01R 24/566; H01R 9/0503; H01R 9/0527; H01L 22/14
See application file for complete search history.

(56) References Cited

U.S. PATENT DOCUMENTS

| | | | |
|---|---|---|---|
| 5,435,745 A | | 7/1995 | Booth |
| 5,879,191 A | * | 3/1999 | Burris .................. H01R 9/0521 439/271 |
| 7,404,737 B1 | * | 7/2008 | Youtsey ................. H01R 31/06 439/578 |
| 2005/0079761 A1 | | 4/2005 | Rodrigues |
| 2005/0090152 A1 | | 4/2005 | Broomall |
| 2006/0094287 A1 | | 5/2006 | Holliday et al. |
| 2012/0309226 A1 | | 12/2012 | Orner |

\* cited by examiner

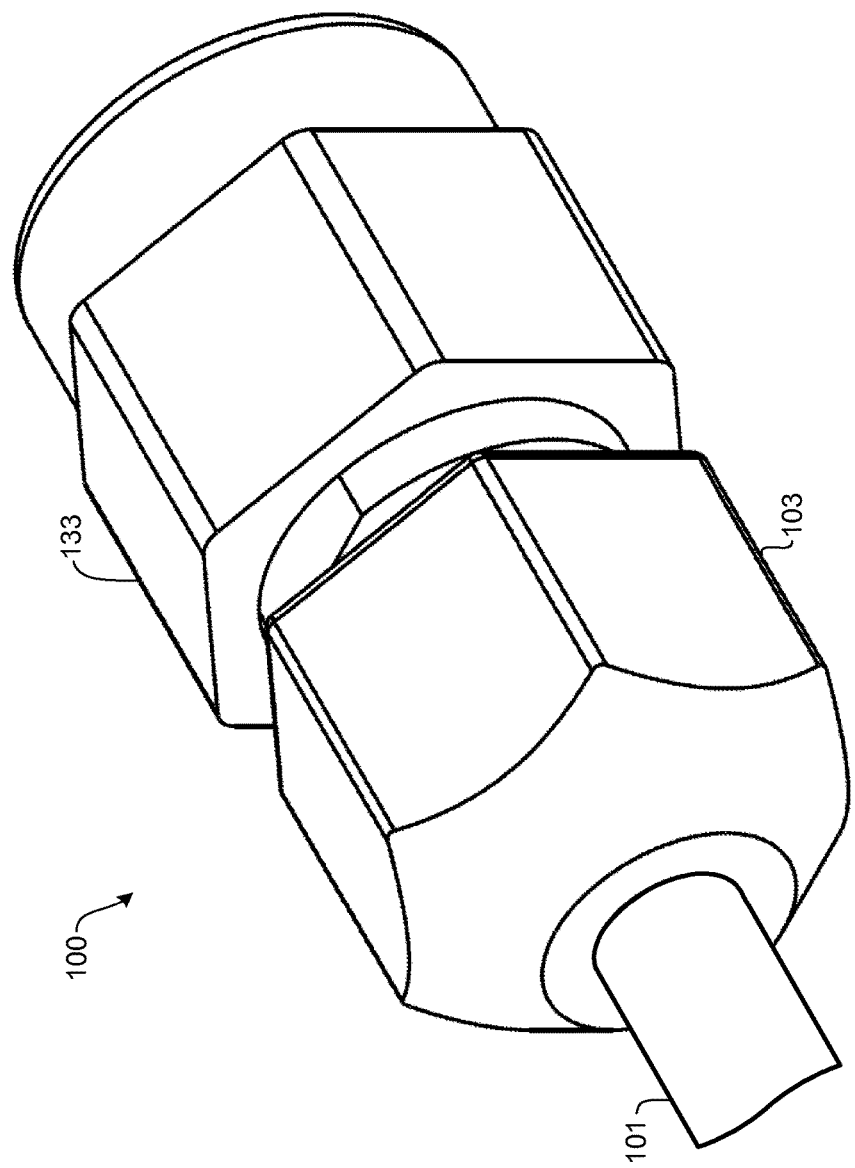

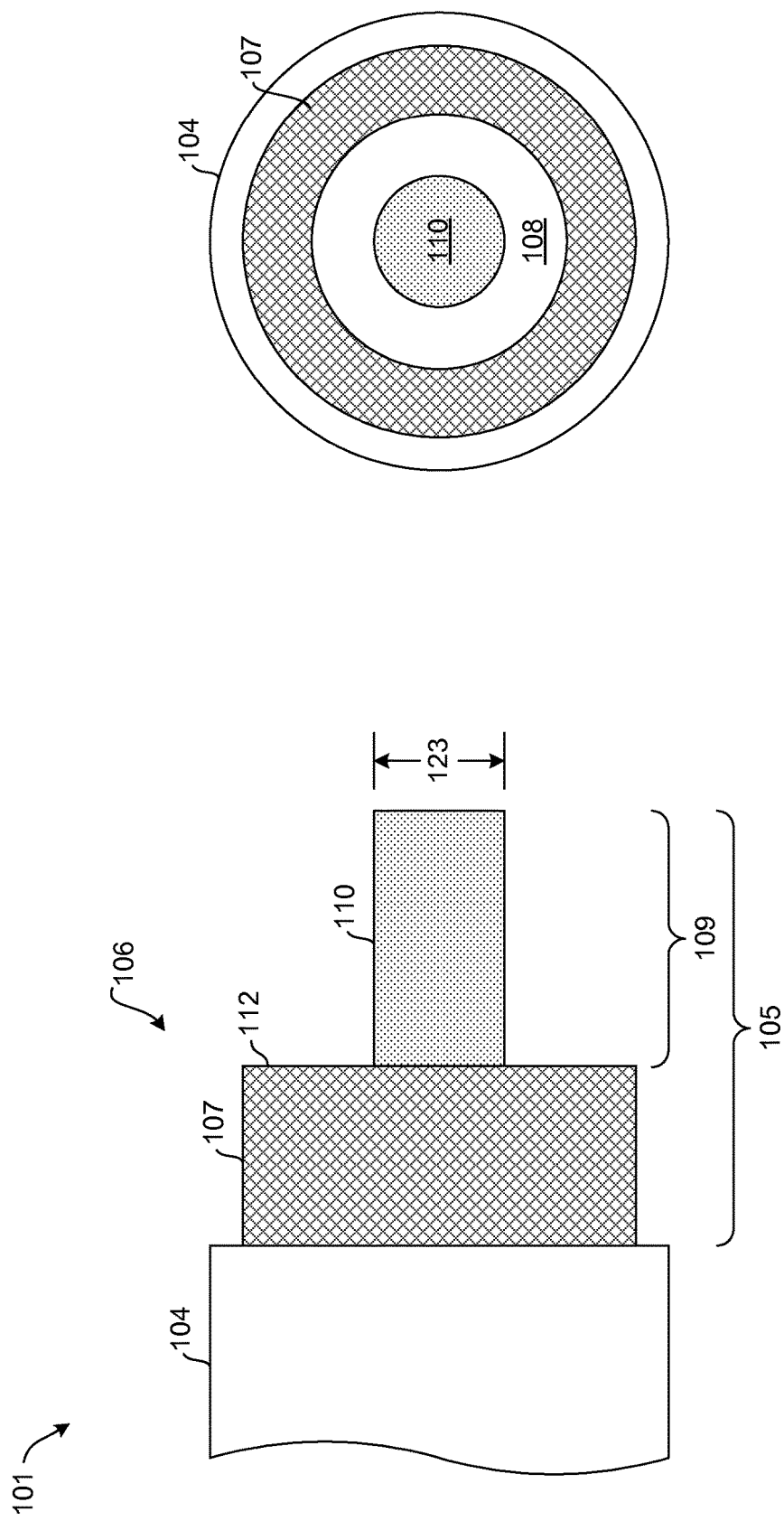

COMPRESSIBLE TEST CONNECTOR FOR COAXIAL CABLES

FIELD OF THE INVENTION

This disclosure is directed to an electrical connector for a cable, and, more particularly, to a test connector for a high-performance coaxial cable.

BACKGROUND

Coaxial cable, or coax, generally has an inner conductor, or core, surrounded by an inner insulating layer. The insulating layer, in turn, is surrounded by a woven, or braided, conductive shield, which is typically connected to ground. This cable body also generally includes an outer insulating layer that covers the braided conductor. Because the inner conductor and the braided conductor share a longitudinal axis, they are said to be coaxial. Such coaxial cables are commonly used as transmission lines for radio frequency (RF) signals.

To allow the cable bodies to be electrically connected to other components, the ends of the cable bodies are generally terminated with connectors. There are many different conventional connectors, which vary based on size, fastening mechanism, such as bayonet or threaded, and configuration. Two examples of different connector types are subminiature version A (SMA) and K-type subminiature connectors. There are many other connector types.

In some instances, the cable body may be manufactured at a different location than the connector. If so, the final assembly of the cable body and the connector may be at a location some distance from where the cable body was fabricated. To control manufacturing costs, it is beneficial to prevent shipping defective or nonconforming cable bodies to final assembly by screening the cable bodies before shipment.

Generally, a coax cable body may be tested for electrical performance on a test and measurement instrument, such as a vector network analyzer (VNA). In a conventional setup, a coax cable body is attached to the VNA by first stripping the outer insulating layer from both ends of the cable body, exposing the braided conductor. The stripped end is then inserted into a loose-fitting test connector having a fixed-diameter channel, which is supposed to make electrical contact with the inner conductor and the woven shield. With this conventional configuration, though, the ground contact between the connector and the braided conductor is not reliable because the fitting is loose. For the same reason, the connection between the test connector and the inner conductor is also unreliable. This can lead to erroneous or undependable conclusions about the electrical performance of the coax cable body.

Embodiments of the disclosed subject matter address these and other issues in the prior art.

SUMMARY OF THE DISCLOSURE

Embodiments of the invention are directed to a connector that may be removably secured to a cable, such as a coaxial cable. The installed connector ensures a reliable electrical connection between the conductive shield of the coaxial cable and the connector. The connector may be easily removed from the coaxial cable, thus providing a temporary termination of the coaxial cable, generally without needing to solder the connector to the coaxial cable.

Accordingly, in one aspect of the invention, a connector for terminating a cable may include a compressible fitting and a crimp nut. The compressible fitting has an inner passage to receive a portion of the cable and a threaded outer wall coaxial with and surrounding the inner passage. The outer wall includes a first slot extending radially through the outer wall and axially away from a first end of the outer wall. The crimp nut is configured to thread onto the outer wall of the compressible fitting, and the crimp nut is operable axially between a first position and a second position. The crimp nut is further configured, in the first position, not to constrict the inner passage and, in the second position, to radially compress the outer wall of the compressible fitting to reduce a bore diameter of the inner passage and to electrically connect the outer wall with the portion of the cable received in the inner passage of the compressible fitting. The connector may include a plurality of additional slots radially spaced about the outer wall from the first slot. Each of the plurality of additional slots extends radially through the outer wall and axially away from the first end of the outer wall.

In another aspect, a method of preparing an unterminated cable for testing may include stripping an outer layer from a first length of an end of the cable to expose an inner layer of the cable; receiving the end of the cable into a first end of an inner passage of a compressible fitting, the compressible fitting having a threaded outer wall coaxial with and surrounding the inner passage, the outer wall including at least one slot extending radially through the outer wall and extending axially away from a first end of the outer wall; operating, from a first position to a second position, a crimp nut configured to thread axially onto the outer wall of the compressible fitting; and radially compressing, as a result of rotating the crimp nut, the outer wall of the compressible fitting to reduce a bore diameter of the inner passage and to electrically connect the outer wall with the end of the cable received in the inner passage of the compressible fitting.

These and other features, aspects, and advantages of the disclosed subject matter will become better understood with reference to the following description, appended claims, and accompanying drawings of embodiments of the invention.

BRIEF DESCRIPTION OF THE DRAWINGS

FIG. 1A is a left, front perspective view of a connector terminating a coaxial cable.

FIG. 2A is a front side view of a length of coaxial cable with an end stripped.

FIG. 2B is a right end view of the length of coaxial cable of FIG. 2A.

DETAILED DESCRIPTION

As described herein, embodiments of the invention are directed to a connector that may be removably secured to a cable, such as a coaxial cable. For example, the connector may temporarily terminate the coaxial cable for electrical testing of the cable before a more permanent connection is soldered to the cable. Because the connector snugly engages the conductive shield of the coaxial cable, the installed connector ensures a reliable electrical connection between the conductive shield and the connector. The connector may also snugly engage the center core of the coaxial cable to ensure a reliable electrical connection between the center core and the connector. Once the testing is complete, the connector may be easily removed from the coaxial cable, for example by twisting a crimp nut and sliding the connector off of the cable. In this way, the connector may provide a temporary termination of the coaxial cable, generally without needing to solder the connector to the coaxial cable.

While this disclosure describes one connector for one end of the coaxial cable, in general each end of the coaxial cable is terminated by a connector. Also, the disclosed connector may be used on cable other than a coaxial cable. Additionally, while the figures depict a male connector, the disclosure likewise applies to female connectors as the disclosed methods and apparatus are not limited to a particular connector.

Figure 1B:
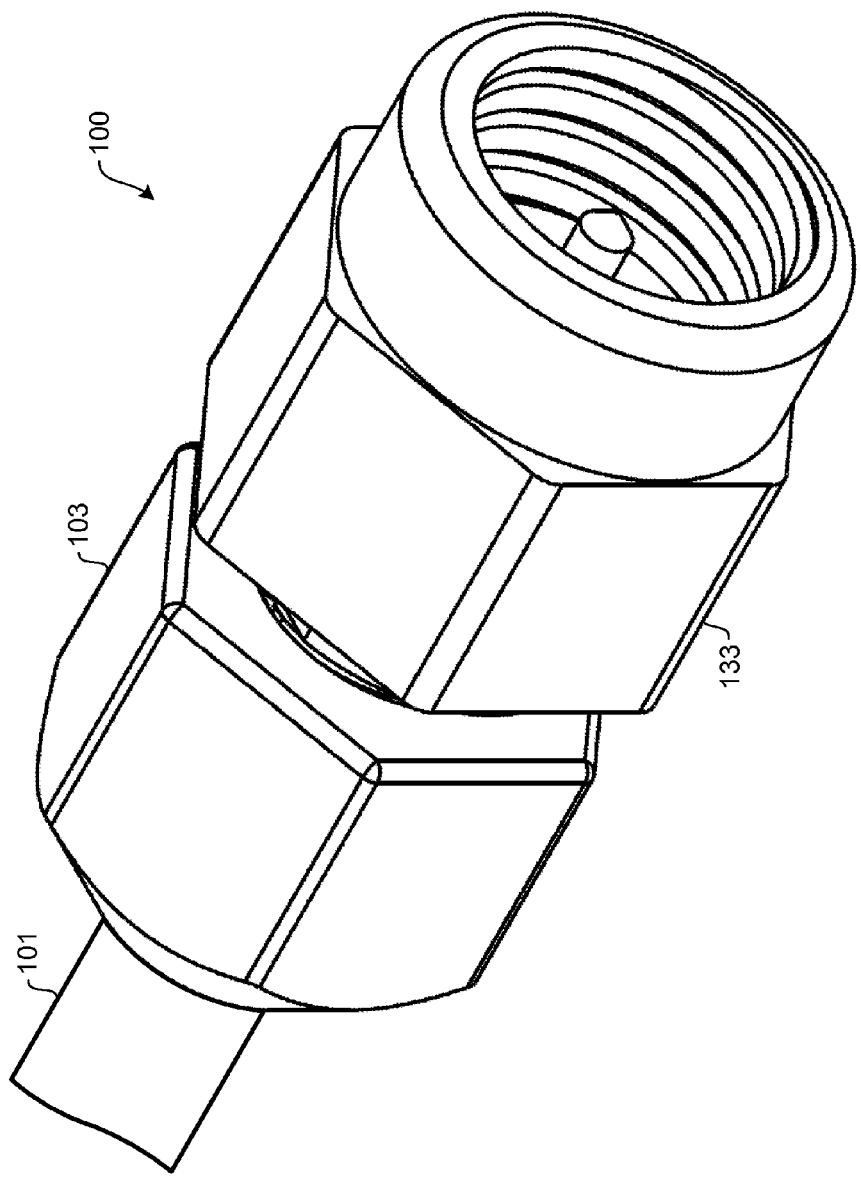
FIG. 1B is a right, front perspective view of the connector terminating a coaxial cable of FIG. 1A.

FIG. 1A is a left, front perspective view of a connector 100 terminating a length of coaxial cable 101. FIG. 1B is a right, front perspective view of the connector terminating a coaxial cable of FIG. 1A. Only a portion of the coaxial cable 101 is shown, as the length of the coaxial cable 101 may vary. As illustrated in FIGS. 1A and 1B, the connector 100 may include a compressible fitting 102 (see FIG. 3) and a crimp nut 103, each of which is described in more detail below. Although the disclosed apparatus and methods will work for terminating low performance cables, the coaxial cable 101 is preferably a high-performance cable capable of radio-frequency transmission of greater than about 12 GHz.

FIG. 2A is a front side view of a length of coaxial cable with an end stripped. FIG. 2B is a right end view of the length of coaxial cable of FIG. 2A. As illustrated in FIGS. 2A and 2B, the coaxial cable 101 may include an outer insulating layer 104. The outer insulating layer 104 may be stripped from some or all of a portion 105 of an end 106 of the coaxial cable 101 to expose a conductive shield 107, or braided shield of the cable 101. The conductive shield 107 and an inner insulating layer 108, which underlies the conductive shield 107, may be further stripped from of a sub-portion 109 of the end 106 of the coaxial cable 101 to expose a center core 110 of the coaxial cable 101. The generally flat end of the conductive shield 107 and the inner insulating layer 108, through which the center core 110 extends, is the reference plane 112 of the end 106 of the cable.

Figure 3:
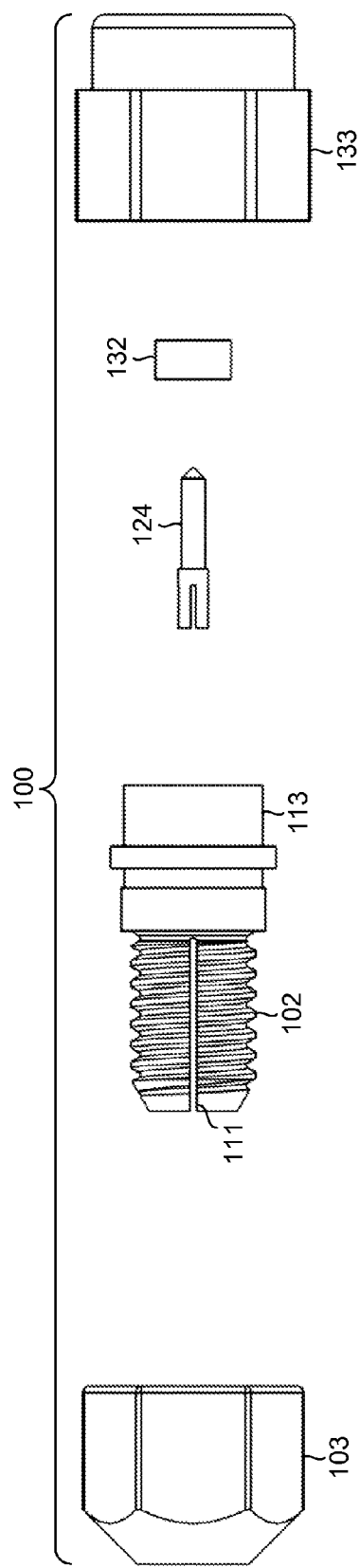
FIG. 3 is an exploded view of the connector of FIGS. 1A and 1B.

FIG. 3 is an exploded view of the connector 100 of FIGS. 1A and 1B. As illustrated in FIG. 3, the connector 100 may also include the crimp nut 103, a connector body 113, the compressible fitting 102, a slot 111, a pin contact 124, and dielectric 132. The compressible fitting 102, the crimp nut 103, the slot 111, and the pin contact 124 are discussed in more detail below. The dielectric 132 surrounds the pin contact 124, for example, as illustrated in FIG. 4.

Figure 4:
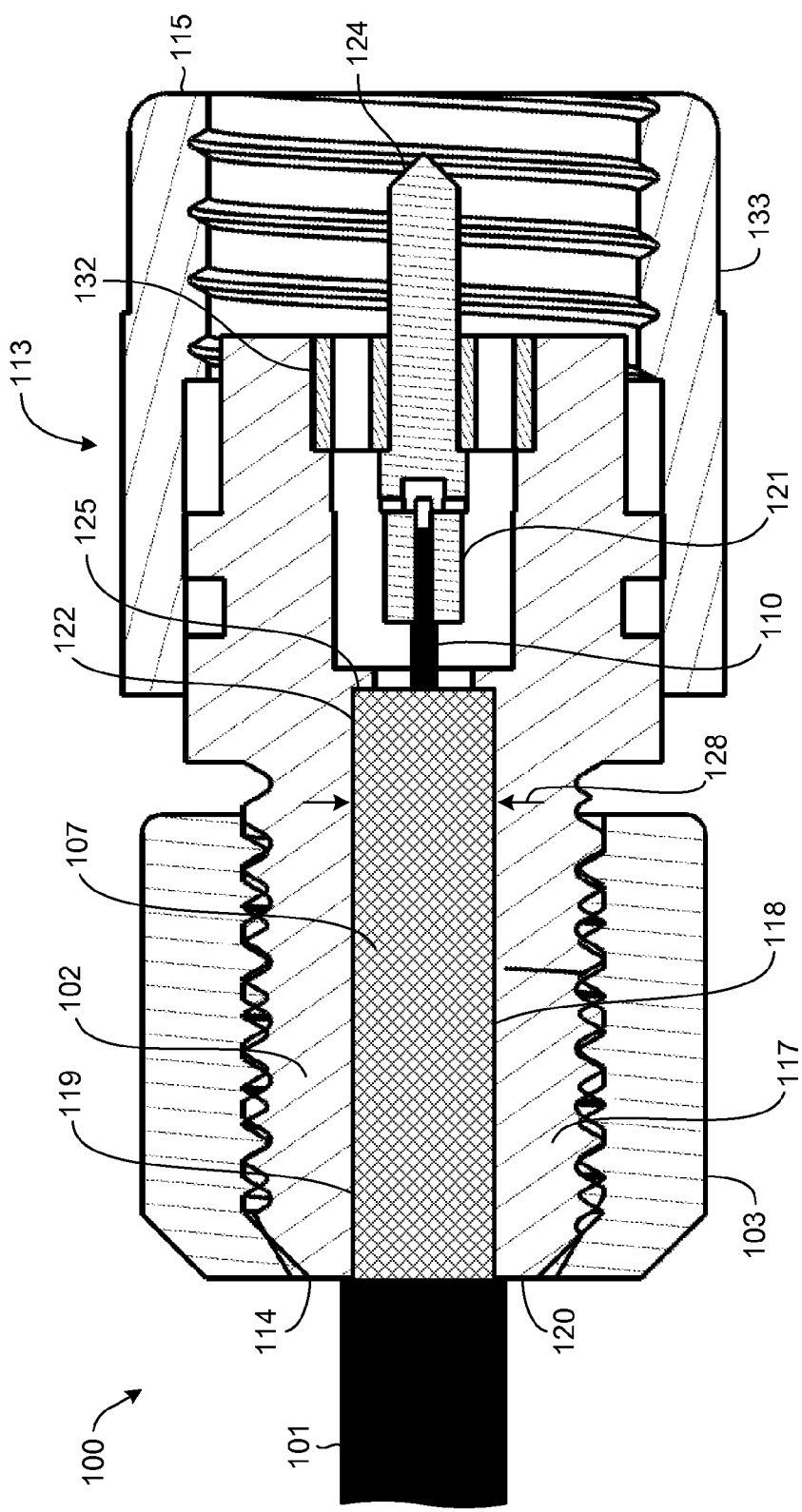
FIG. 4 is a front, partial cross-sectional view of the connector and coaxial cable of FIGS. 1A and 1B. The connector is shown in axial cross section, but the coaxial cable is not.

FIG. 4 is a front, partial cross-sectional view of the connector 100 and the coaxial cable 101 of FIGS. 1A and 1B. The connector 100 is shown in axial cross section, but the coaxial cable 101 is not. A portion 105 of the cable may be stripped as discussed above for FIGS. 2A and 2B. As illustrated in FIG. 4, the connector 100 may include the connector body 113, the compressible fitting 102, and the crimp nut 103. The coaxial cable 101 may be inserted into the compressible fitting 102, such as described below.

The connector body 113 shown in FIG. 4 has a first end 114 and a second end 115. The compressible fitting 102, which is discussed in more detail below, is at the first end 114 of the connector body 113. The second end 115 of the connector body 113 is configured to join with a mating connector 116 (see FIG. 7). For example, the second end 115 of the connector body 113 may include connector nut 133. The mating connector 116 may be, for example, a male or a female coaxial connector, such as an SMA connector, a 3.5 mm connector, or a 2.92 mm connector.

The compressible fitting 102 has a resilient outer wall 117 and an inner passage 118 to receive a portion 105 of the cable. For example, the cable 101 may be inserted into a first end 119 of the inner passage 118. Preferably, the outer wall 117 is threaded, for example, as shown in FIGS. 3 and 4. Also, the outer wall 117 preferably is coaxial with and surrounds the inner passage 118. The inner passage 118 may be essentially smooth, to avoid snagging or damaging the cable 101, particularly the conductive shield 107 of the coaxial cable 101, as it is inserted into or removed from the inner passage 118.

The outer wall 117 of the compressible fitting 102 may include at least one slot 111, such as the slot 111 shown in FIG. 3. Preferably, the slot 111 extends radially through the resilient outer wall 117 and extends away from a first end 120 of the outer wall 117. Some embodiments include a plurality of slots 111 that are radially spaced about the outer wall 117. The slots 111 may be evenly spaced about the outer wall 117. For example, if there are three slots 111, each slot 111 may be about 120 degrees from the adjacent slots 111. In some embodiments, the slots 111 are not evenly spaced.

Figure 5:
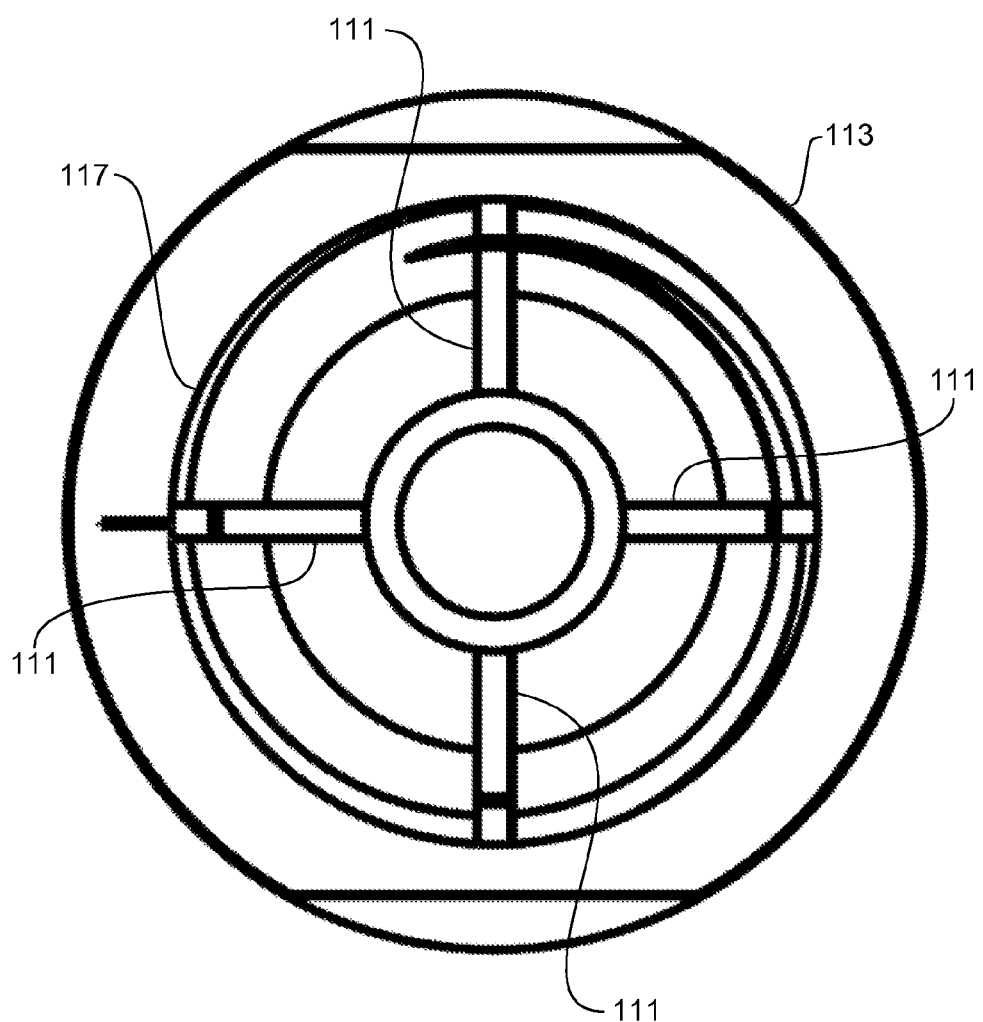
FIG. 5 is a left end view of the connector body of FIG. 3, shown in isolation.

FIG. 5 is a left end view of the connector body 113 of the connector 100 of FIGS. 1A and 1B in isolation. As illustrated in FIG. 5, the compressible fitting 102 may include a plurality of slots 111, such as four slots, about the outer wall 117 of the compressible fitting 102.

Returning to FIG. 4, the connector 100 may also include a contact receptacle 121 at a second end 122 of the inner passage 118. The contact receptacle 121 may snugly receive the center core 110 of the coaxial cable 101 and establish electrical contact with the center core 110. The contact receptacle 121 may be spring-loaded to expand radially to accommodate an outer diameter 123 (see FIG. 2A) of the center core 110. Also, the connector 100 may include the pin contact 124 that is in electrical contact with the contact receptacle 121. The pin contact 124 generally extends axially away from the contact receptacle 121 and toward the second end 115 of the connector body 113.

The connector 100 may also include a shoulder 125 at the second end 122 of the inner passage 118. As the coaxial cable 101 is inserted into the inner passage 118, the reference plane 112 of the cable 101 may abut the shoulder 125 of the inner passage 118 to properly position the cable 101 within the connector 100.

The crimp nut 103 is configured to thread onto, or otherwise engage, the outer wall 117 of the compressible fitting 102. The crimp nut 103 may be operated axially between a first position 126 and a second position 127 as well as between the second position 127 and the first position 126 (also see FIGS. 6A and 6B). In the first position 126, the crimp nut 103 does not constrict the inner passage 118. In the second position 127, the crimp nut 103 radially compresses the resilient outer wall 117 of the compressible fitting 102, for example, by pinching or collapsing one or more of the slots 111 of the outer wall 117 as the crimp nut 103 operates from the first position 126 to the second position 127. This compression reduces a bore diameter 128 of the inner passage 118. The compression also electrically connects the outer wall 117 with the portion 105 of the cable received in the inner passage 118 of the compressible fitting 102 by moving the outer wall 117 into physical contact with the portion 105 of the cable. For example, the outer wall 117 may firmly contact the conductive shield 107 of the stripped end 106 of the coaxial cable 101.

Figure 6A:
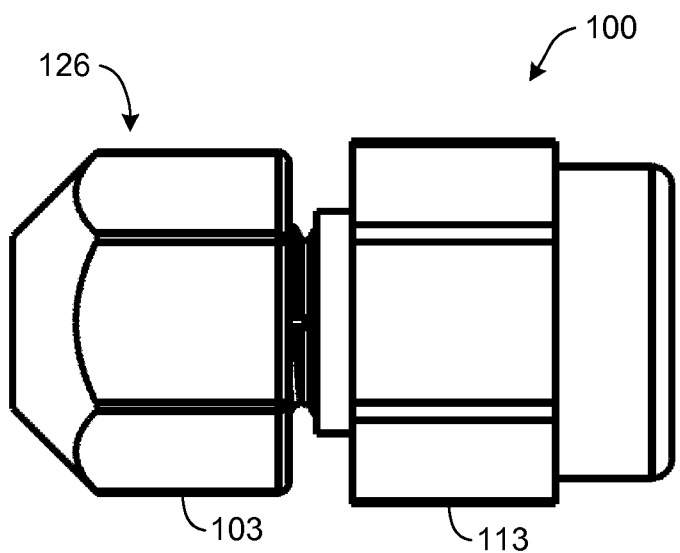
FIG. 6A is a front side view of the connector and coaxial cable of FIGS. 1A and 1B, with a crimp nut shown in a first axial position.

FIG. 6A is a front side view of the connector 100 of FIGS. 1A and 1B, with a crimp nut 103 shown in an example of a first axial position 126. With reference to FIG. 4 and FIG. 6A, when the crimp nut 103 is in the first position 126, the compressible fitting 102 may slidingly receive the coaxial cable 101 within the inner passage 118 (see FIG. 4) of the compressible fitting 102 because the crimp nut 103 does not constrict the inner passage 118.

Figure 6B:
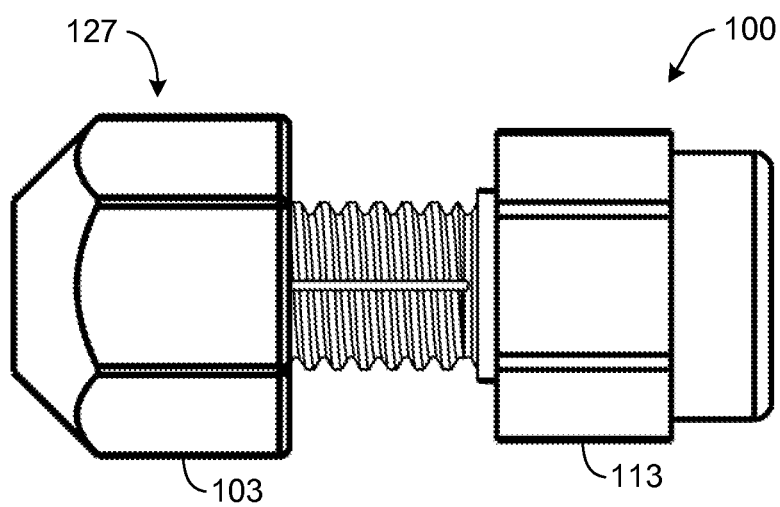
FIG. 6B is a front side view of the connector and coaxial cable of FIGS. 1A and 1B, with a crimp nut shown in a second axial position.

FIG. 6B is a front side view of the connector 100 of FIGS. 1A and 1B, with a crimp nut 103 shown in an example of a second axial position 127. With reference to FIG. 4 and FIG. 6B, when the crimp nut 103 is in the second position 127, the compressible fitting 102 may snugly secure the coaxial cable 101 within the inner passage 118 because the crimp nut 103 radially compresses the outer wall 117 of the compressible fitting 102. The crimp nut 103 may be moved or operated from the first position 126 to the second position 127, or vice versa, by, for example, twisting or rotating the crimp nut 103 about the threaded outer wall 117 or by sliding the crimp nut 103 along the outer wall 117 if, for example, the outer wall 117 is not threaded.

Figure 7:
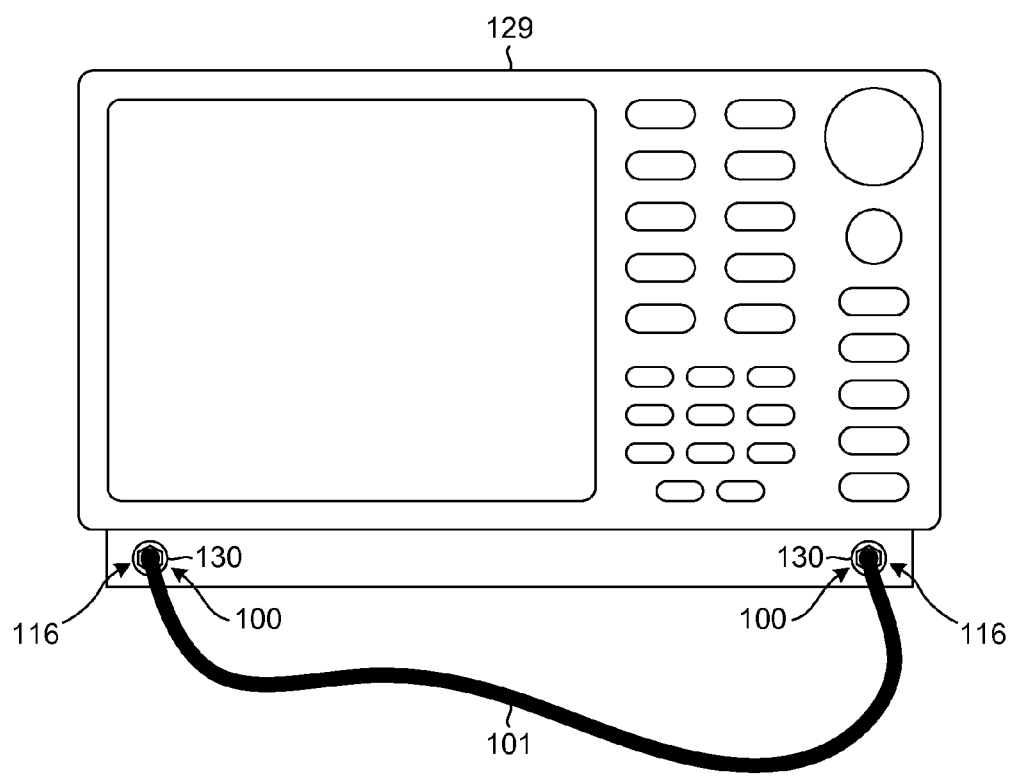
FIG. 7 is a functional block diagram showing the connector and coaxial cable of FIGS. 1A and 1B, with the connector mating with a test and measurement unit.

FIG. 7 is a functional block diagram showing two connectors 100 and coaxial cable 101 of FIGS. 1A and 1B, with the connector 100 mating with a test and measurement unit 129. Both ends of the coaxial cable 101 may include a connector 100, with the ends connecting to mating connectors 116 of an input 130 and an output 131 of, for example, a vector network analyzer (VNA). In this way, for example, the coaxial cable 101 may be tested for electrical performance. Once the test is completed, each connector 100 may be easily removed by operating the crimp nut 103 from the second position 127 to the first position 126, and sliding the cable 101 out from the inner passage 118 of the connector 100.

Typically, each connector 100 may only accommodate one cable size or a small range of similar cable sizes. For example, different cables may have different shapes or diameters. Also, different coaxial cables may have center cores with different outer diameters. Additionally, each connector 100 typically includes one particular connector style, such as SMA, 3.5 mm, or 2.92 mm, depending on what the connector 100 is to be connected to. Thus, a kit may include a plurality of the connectors 100, in which the plurality of the connectors is configured to receive at least two different cables or to connect to at least two different mating connectors, or both. For example, the kit may include a first connector having a 2.92 mm connector and a contact receptacle to accommodate a first center core diameter, a second connector having a 2.92 mm connector and a contact receptacle to accommodate a second center core diameter, a third connector having an SMA connector and a contact receptacle to accommodate the first center core diameter, and a fourth connector having an SMA connector and an inner passage to accommodate a coaxial cable with a braided shield having a first diameter. Again, these are just examples, and the kit may include a number of connectors to accommodate some or all of any combination of cable styles, cable sizes, connector styles, and connector sizes.

In operation, a cable 101 to be terminated may be stripped, for example, as discussed above for FIG. 3. The stripped end may then be inserted into the inner passage 118 of the connector 100 until the reference plane 112 of the stripped end 106 of the cable is seated against the shoulder 125 of the connector 100. Once the reference plane 112 is seated, the crimp nut 103 may be operated, or tightened, from its first position 126 to its second position 127, thereby radially compressing the outer wall 117 of the compressible fitting 102. The crimp nut 103 may be tightened until the compressible fitting 102 snugly secures the coaxial cable 101 within the inner passage 118. For example, the crimp nut 103 may be tightened under finger pressure of the operator until the crimp nut 103 no longer rotates under finger pressure. Alternatively, once the reference plane 112 is seated, the connector 100 and cable 101 may be connected to a test and measurement unit 129, such as a VNA. Once connected, the operator may slowly tighten the crimp nut 103 until the VNA indicates that there is a proper ground connection between the conductive shield 107 and the connector 100. In this way, the operator may receive a visual response from the VNA to indicate that the crimp nut 103 is properly adjusted.

Once testing is completed, or once the operator wants the connector 100 to be removed from the cable 101, the crimp nut 103 may be operated, or loosened, from its second position 127 to its first position 126. This allows the compressible fitting 102 to resiliently return to its uncompressed position, in which the inner passage 118 is not constricted with respect to the end 106 of the cable 101. Then, the operator may slide the cable 101 out of the connector 100. If desired, the connector 100 may then be installed onto another cable 101.

Thus, a method of preparing an unterminated cable 101 for testing may include stripping an outer layer 104 from a first length 105 of an end 106 of the cable to expose an inner layer 108 of the cable 101; receiving the end 106 of the cable into a first end 119 of an inner passage 118 of a compressible fitting 102, the compressible fitting 102 having a threaded outer wall 117 coaxial with and surrounding the inner passage 118, the outer wall 117 including at least one slot 111 extending radially through the outer wall 117 and extending away from a first end 120 of the outer wall 117; operating, from a first position 126 to a second position 127, a crimp nut 103 configured to thread onto the outer wall 117 of the compressible fitting 102; and radially compressing, as a result of rotating the crimp nut 103, the outer wall 117 of the compressible fitting 102 to reduce a bore diameter 128 of the inner passage 118 and to electrically connect the outer wall 117 with the end 106 of the cable received in the inner passage 118 of the compressible fitting 102.

Stripping the outer layer 104 may include, for example, stripping the outer insulating layer 104 from the first length 105 of the end of the coaxial cable 101 to expose a conductive shield 107 of the coaxial cable 101. Also, the method may further include stripping the conductive shield 107 and an inner insulating layer 108 from a second length 109 of the end of the coaxial cable 101 to expose a center core 110 of the coaxial cable 101. The second length 109 is a sub-portion of the first length 105.

The method may also include snugly receiving a center core 110 of the first length 105 of the coaxial cable 101 into a contact receptacle 121 at a second end 122 of the inner passage 118, and establishing electrical contact between the contact receptacle 121 and the center core 110.

Additionally, since the compressible fitting 102 may be part of a connector body 113, the method may also include joining another part of the connector body 113 to a mating connector 116 of a test and measurement unit 129, such as a vector network analyzer. The mating connector 116 may be, for example the input 130 or the output 131 of the test and measurement unit 129.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments of the invention have been illustrated and described for purposes if illustration, it will be understood that various modifications may be made without departing from the spirit and scope of the invention. Accordingly, the invention should not be limited except as by the appended claims.

What is claimed is:

1. A connector for terminating a cable, the connector comprising:
   a compressible fitting having an inner passage to receive a portion of the cable, the compressible fitting also having a threaded outer wall coaxial with and surrounding the inner passage, the outer wall including a first slot extending radially through the outer wall, the first slot further extending axially away from a first end of the outer wall; and
   a crimp nut configured to thread onto the outer wall of the compressible fitting, the crimp nut being operable axially between a first position and a second position, the crimp nut further configured, in the first position, not to constrict the inner passage and, in the second position, to radially compress the outer wall of the compressible fitting to reduce a bore diameter of the inner passage and to electrically connect the outer wall with the portion of the cable received in the inner passage of the compressible fitting by compressing said slot;
   a connector body, the compressible fitting being at a first end of the connector body, and a second end of the connector body being configured to join with a mating connector;
   a contact receptacle at a second end of the inner passage to receive a center core of the portion of the coaxial cable and to establish electrical contact with the center core;
   a pin contact in electrical contact with the contact receptacle and extending axially away from the contact receptacle and wherein the cable is a coaxial cable, and in which the portion of the cable received in the inner passage of the compressible fitting is inserted into a first end of the inner passage.

2. The connector of claim 1, further comprising a plurality of additional slots radially spaced about the outer wall from the first slot, each of the plurality of additional slots extending radially through the outer wall and extending axially away from the first end of the outer wall.

3. The connector of claim 2, in which the first slot and the plurality of additional slots are evenly spaced about the outer wall.

4. The connector of claim 1, in which the portion of the coaxial cable received in the inner passage of the compressible fitting is stripped to expose a braided shield of the coaxial cable.

5. The connector of claim 1, in which the contact receptacle is spring-loaded to expand radially to accommodate an outer diameter of the center core.

6. A kit comprising a plurality of the connectors of claim 1, in which a plurality of connectors are configured to receive at least two different cables or to connect to at least two different mating connectors, or both.

7. A method of preparing an unterminated cable for testing, the method comprising:
   stripping an outer layer from a first length of an end of the cable to expose an inner layer of the cable;
   receiving the end of the cable into a first end of an inner passage of a compressible fitting, the compressible fitting having a threaded outer wall coaxial with and surrounding the inner passage, the outer wall including at least one slot extending radially through the outer wall and extending axially away from a first end of the outer wall;
   operating, from a first position to a second position, a crimp nut configured to thread axially onto the outer wall of the compressible fitting; and
   radially compressing, as a result of rotating the crimp nut, the outer wall of compressible fitting to reduce a bore diameter of the inner passage and to electrically connect the outer wall with the end of the cable received in the inner passage of the compressible fitting; wherein the unterminated cable is an unterminated coaxial cable, Wherein stripping the outer layer comprises stripping an outer insulating layer from the first length of the end of the coaxial cable to expose a conductive shield of the coaxial cable, the method further comprising stripping the conductive shield and an inner insulating layer from a second length of the end of the coaxial cable to expose a center core of the coaxial cable, the second length being a subsection of the first length.

8. The method of claim 7, further comprising receiving the center core of the first length of the coaxial cable into a contact receptacle at a second end of the inner passage, and establishing electrical contact between the contact receptacle and the center core.

9. The method of claim 7, in which the compressible fitting is part of a connector body, the method further comprising joining a second part of the connector body to a mating connector of a test and measurement unit.

10. The method of claim 7, in which a connector body comprises the compressible fitting, in which the compressible fitting is at a first end of the connector body, the method further comprising joining a second end of the connector body to a mating connector of a vector network analyzer.

\* \* \* \* \*